United States Patent
Suh et al.

(10) Patent No.: US 7,855,503 B2
(45) Date of Patent: Dec. 21, 2010

(54) FLAT PANEL DISPLAY AND METHOD OF MANUFACTURING THE SAME

(75) Inventors: Min-Chul Suh, Suwon-si (KR); Hun-Jung Lee, Suwon-si (KR); Yeon-Gon Mo, Suwon-si (KR); Jae-Bon Koo, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 412 days.

(21) Appl. No.: 11/373,802

(22) Filed: Mar. 10, 2006

(65) Prior Publication Data

US 2006/0220542 A1    Oct. 5, 2006

(30) Foreign Application Priority Data

Mar. 30, 2005    (KR) .................. 10-2005-0026501

(51) Int. Cl.
*H01L 51/50* (2006.01)
(52) U.S. Cl. .................. 313/504; 257/72; 313/506
(58) Field of Classification Search .................. 313/112, 313/498–512; 438/21; 437/173
See application file for complete search history.

(56) References Cited

U.S. PATENT DOCUMENTS

| | | | | |
|---|---|---|---|---|
| 5,132,248 | A * | 7/1992 | Drummond et al. ......... | 505/325 |
| 6,850,005 | B2 * | 2/2005 | Yoneda et al. .............. | 313/506 |
| 6,864,628 | B2 * | 3/2005 | Yamazaki et al. ........... | 313/504 |
| 2002/0104995 | A1 * | 8/2002 | Yamazaki et al. ............ | 257/72 |
| 2002/0119584 | A1 | 8/2002 | Duthaler et al. | |
| 2004/0004430 | A1 | 1/2004 | Hamada et al. | |
| 2004/0251823 | A1 * | 12/2004 | Park et al. .................... | 313/506 |
| 2005/0046345 | A1 * | 3/2005 | Park ........................... | 313/506 |
| 2005/0064091 | A1 | 3/2005 | Yamazaki | |

FOREIGN PATENT DOCUMENTS

| | | | |
|---|---|---|---|
| EP | 1357772 | A2 | 10/2003 |
| EP | 1361619 | A2 | 11/2003 |
| JP | 2002-090776 | | 3/2002 |

(Continued)

OTHER PUBLICATIONS

European Search Report issued by the European Patent Office on May 22, 2007.

(Continued)

*Primary Examiner*—Nimeshkumar D Patel
*Assistant Examiner*—Mary Ellen Bowman
(74) *Attorney, Agent, or Firm*—Knobbe Martens Olson & Bear LLP (57) ABSTRACT

A flat panel display capable of preventing a pixel circuit from electrically short-circuiting, and a method of manufacturing the flat panel display are disclosed. In one embodiment, the flat panel display includes an insulating film having an aperture, a pixel electrode having a portion exposed by the aperture of the insulating film, a conductor formed on the insulating film, and a capping layer covering the conductor. According to embodiments of the present invention, the conductor is formed from a conductive paste and the rough surface of the conductive paste is passivated by a capping layer formed on the conductor, and thus, a short circuit between the conductor and an opposing pixel electrode can be prevented.

48 Claims, 8 Drawing Sheets

FOREIGN PATENT DOCUMENTS

| | | |
|---|---|---|
| JP | 2002-324810 | 11/2002 |
| JP | 2003-100209 | 4/2003 |
| JP | 2003-249657 | 9/2003 |
| JP | 2004-004797 | 1/2004 |
| JP | 2004-046087 | 2/2004 |
| JP | 2004-346082 | 12/2004 |
| JP | 2005-019535 | 1/2005 |
| KR | 10-2001-0083213 A | 8/2001 |
| KR | 10-2004-0061656 A | 7/2004 |
| WO | WO 2004/057416 A1 | 7/2004 |
| WO | WO 2004/075245 A2 | 9/2004 |

OTHER PUBLICATIONS

Supplementary Search Report by the European Patent Office on Sep. 18, 2006.

Notice to Submit Response by Korean Intellectual Property Office on Aug. 22, 2006.

Summons to attend oral proceedings by European Patent Office dated Nov. 2, 2007.

First Office Action for Chinese Patent Application No. 2006100737795 dated Sep. 5, 2008 by State Intellectual Property Office, P.R. China.

* cited by examiner

FLAT PANEL DISPLAY AND METHOD OF MANUFACTURING THE SAME

CROSS-REFERENCE TO RELATED PATENT APPLICATIONS

This application claims the benefit of Korean Patent Application No. 10-2005-0026501, filed on Mar. 30, 2005, in the Korean Intellectual Property Office, the disclosure of which is incorporated herein in its entirety by reference.

BACKGROUND OF THE INVENTION

1. Field of the Invention

The present invention relates to a flat panel display and a method of manufacturing the same, and more particularly, to a flat panel display including a capping layer that covers a conductor and a method of manufacturing the flat panel display.

2. Description of the Related Technology

A thin film transistor (TFT) used in flat panel displays, such as, liquid crystal displays, organic light emitting displays, or inorganic light emitting displays, serves as i) a switching device that controls the operation of each pixel and ii) a driving device that drives each pixel.

The TFT typically includes: i) a semiconductor layer having a source area, a drain area, and a channel region formed between the source and drain areas, ii) a gate electrode insulated from the semiconductor layer and located correspondingly to the channel region, and iii) a source electrode and a drain electrode contacting the source and drain areas, respectively.

Recent flat panel displays are required to be thin and flexible. To obtain a flexible flat panel display, many recent attempts have been made to use plastic instead of glass for the substrate of the flat panel display. A low-temperature process, instead of a high-temperature process, is required to manufacture a TFT having such a plastic substrate. Hence, it is difficult to form a conventional polysilicon-series TFT on the plastic substrate.

To solve this problem, an organic semiconductor has been introduced. Because the organic semiconductor can be formed in a low-temperature process, a low-priced TFT can be obtained. However, the organic semiconductor can be easily damaged during a subsequent wet process, so special care is required.

When a flat panel display is manufactured using such a TFT, subsequent processes, such as, a process of forming a pixel circuit including a TFT, a pixel electrode forming process, etc., are very complicated.

In this flat panel display, various electrodes or lines may pass through an insulating film formed thereon due to the roughness of the surfaces of the electrodes or lines and contact a conductor formed on the insulating film. The contact with the conductor may cause a circuit, particularly, a pixel circuit, to electrically short-circuit.

SUMMARY OF CERTAIN INVENTIVE ASPECTS

One aspect of the present invention provides a flat panel display that can prevent a pixel circuit from electrically short-circuiting, and a method of manufacturing the flat panel display.

Another aspect of the present invention provides a flat panel display including an insulating film having an aperture, a pixel electrode having a portion exposed by the aperture of the insulating film, a conductor formed on the insulating film, and a capping layer covering the conductor.

Another aspect of the present invention provides a flat panel display including a pixel electrode formed on a substrate, at least one conductor formed on the substrate, and a capping layer covering the conductor.

In one embodiment, the substrate includes at least one thin film transistor. In one embodiment, the thin film transistor includes a source and drain electrode, a semiconductor layer contacting the source and drain electrodes, a gate electrode insulated from the source and drain electrodes and the semiconductor layer, and a capping layer covering at least one of i) the source and drain electrodes and ii) the gate electrode.

Another aspect of the present invention provides a method of manufacturing a flat panel display, including coating a substrate with paste including conductive particles, forming a conductor of the paste, and forming a capping layer to cover the conductor.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 1:
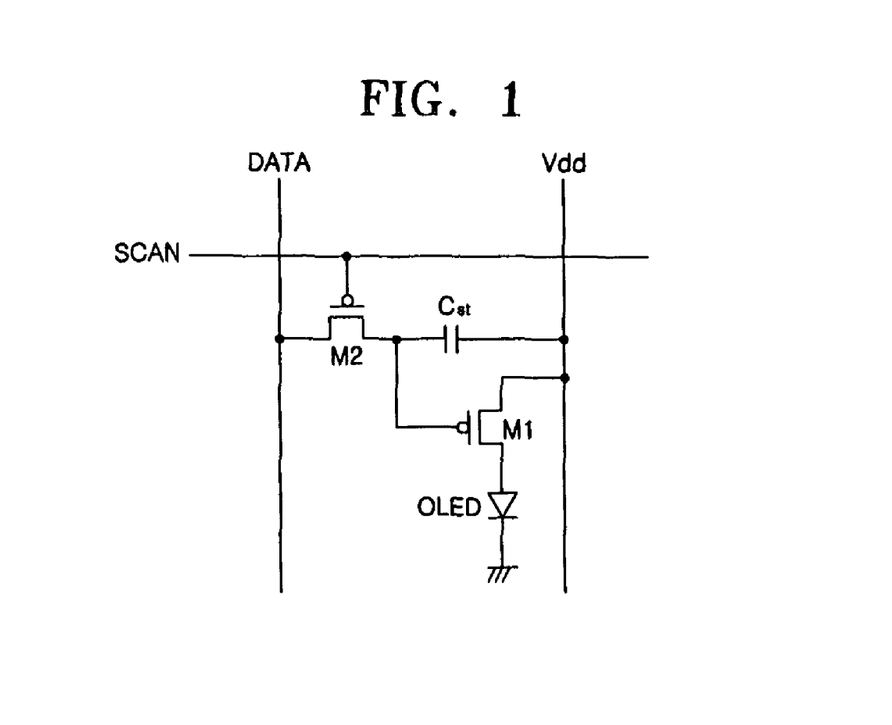
FIG. 1 is a circuit diagram of a pixel of an active-matrix (AM) organic light emitting display according to an embodiment of the present invention.

Referring to FIG. 1, each pixel of an active-matrix (AM) organic light emitting display according to an embodiment of the present invention. In one embodiment, the pixel circuit includes at least two thin film transistors (TFTs), which are a switching TFT (M2) and a driving TFT (M1), a storage capacitor (Cst), and an organic light emitting diode (OLED).

The switching TFT (M2) is switched on/off by a scan signal applied to a scan line (SCAN) and transmits a data signal applied to a data line (DATA) to the storage capacitor (Cst) and the driving TFT (M1). The driving TFT (M1) determines the amount of current flowing into the OLED according to the data signal received from the switching TFT (M2). The storage capacitor (Cst) stores the data signal received from the switching TFT (M2) for one frame.

In one embodiment, M1 and M2, as shown in FIG. 1, are PMOS TFTs. In another embodiment, M1 and M2 are other types of transistors. For example, at least one of M1 and M2 may be an NMOS TFT. Also, the numbers of TFTs and capacitors are not limited to the numbers shown in FIG. 1. For example, larger numbers of TFTs and capacitors than the numbers shown in FIG. 1 may be included in each pixel.

Figure 2:
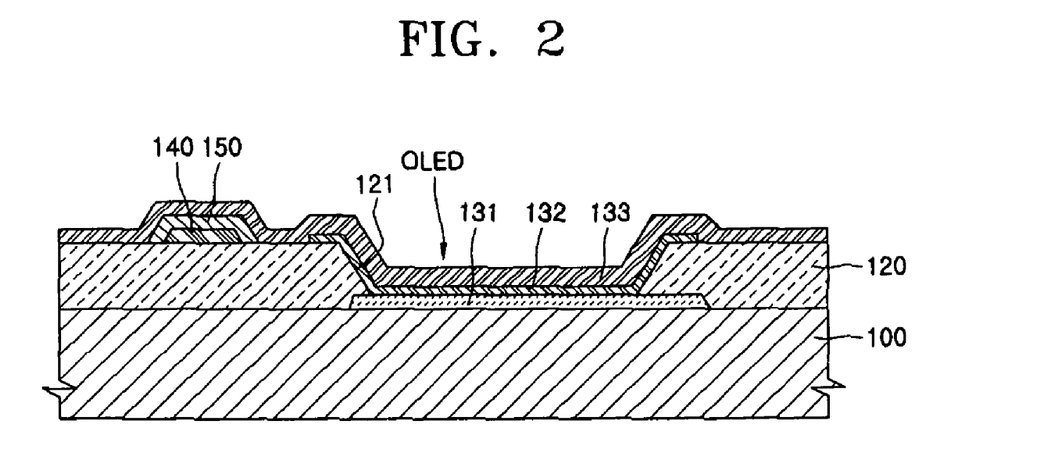
FIGS. 2 through 14 are cross-sectional views of various embodiments of the AM organic light emitting display of FIG. 1.

FIG. 2 is a cross-section of an example of an AM organic light emitting display as shown in FIG. 1. As illustrated in FIG. 2, the AM organic light emitting display includes a pixel electrode 131 formed on a TFT substrate 100, an organic light emitting layer 132 formed on the pixel electrode 131, and an opposite electrode 133 covering the organic light emitting layer 132.

In one embodiment, the TFT substrate 100 comprises a glass, plastic, or metal substrate on which a pixel circuit as shown in FIG. 1 is formed. The TFT substrate 100 will be described in greater detail later.

The pixel electrode 131 is generally formed to have a pattern corresponding to a pixel pattern on the TFT substrate 100. Although not shown in FIG. 2, the pixel electrode 131 is electrically connected to the pixel circuit which is included in the TFT substrate 100.

In one embodiment, at least a portion of the pixel electrode 131 is covered by a pixel defining film 120 formed of an insulative material. In the FIG. 2 embodiment, two side portions of the pixel electrode 131 are covered by the pixel defining film 120. An aperture 121 is formed in the pixel defining film 120 to expose the pixel electrode 131. The organic light emitting layer 132 is formed on the aperture 121 of the pixel defining film 120 to cover the exposed portion of the pixel electrode 131. The opposite electrode 133 is formed on the organic light emitting layer 132. In one embodiment, the opposite electrode 133 may be formed as a single layer to cover all of the pixels included in the TFT substrate 100. In another embodiment, the opposite electrode 133 may be patterned.

In one embodiment, the pixel electrode 131 may serve as an anode electrode, and the opposite electrode 133 may serve as a cathode electrode. In another embodiment, the pixel electrode 131 may serve as a cathode electrode, and the opposite electrode 133 may serve as an anode electrode. In all of the following embodiments, for convenience, a configuration where the pixel electrode 131 serves as an anode electrode, and the opposite electrode 133 serves as a cathode electrode is described.

In bottom emission type light emitting displays, where light is emitted through the pixel electrode 131 and the substrate 100, the pixel electrode 131 may be a transparent electrode, and the opposite electrode 133 may be a reflective electrode. The transparent electrode used as the pixel electrode 131 may be formed of a transparent material of ITO, IZO, $In_2O_3$, or ZnO. The reflective electrode used as the opposite electrode 133 may be formed of metal, such as, Ag, Mg, Al, Pt, Pd, Au, Ni, Nd, Ir, Cr, Li, Ca, or a compound thereof that have low work functions.

In top emission type light emitting displays, where light is emitted through the opposite electrode 133, the pixel electrode 131 may be a reflective electrode, and the opposite electrode 133 may be a transparent electrode. The reflective electrode used as the pixel electrode 131 may be formed of a reflective film of, for example, Ag, Mg, Al, Pt, Pd, Au, Ni, Nd, Ir, Cr, Li, Ca, or a compound thereof and a film of, for example, ITO, IZO, $In_2O_3$, or ZnO, which have high work functions. The transparent electrode used as the opposite electrode 133 may be formed of a low work function layer formed of, for example, Ag, Mg, Al, Pt, Pd, Au, Ni, Nd, Ir, Cr, Li, Ca, or a compound thereof and an auxiliary electrode layer or a bus electrode line of a transparent conductive material, such as, ITO, IZO, $In_2O_3$, or ZnO.

In both side emission type light emitting displays, where light is emitted through the electrodes 131 and 133, the pixel electrode 131 and the opposite electrode 133 may be both formed of a transparent material.

The materials of the pixel electrode 131 and the opposite electrode 133 are not limited to the above-described materials but may be a conductive organic material or conductive paste in which conductive particles of, for example, Ag, Mg, or Cu are included. In one embodiment, when conductive paste is used to form the two electrodes 131 and 133, the conductive paste may be printed using an inkjet printing method and then fired to turn into an electrode.

In one embodiment, the organic light emitting layer 132 may be a small molecular organic layer or a polymer organic layer. The small molecular organic layer may be formed by, for example, stacking a hole injection layer (HIL), a hole transport layer (HTL), an emissive layer (EML), an electron transport layer (ETL), an electron injection layer (EIL), etc., in a single or complex structure. An organic material used may be various materials including copper phthalocyanine (CuPc), N,N-Di(naphthalene-1-yl)-N,N'-diphenyl-benzidine;NPB, and tris-8-hydroxyquinoline aluminum (Alq3). In one embodiment, the small molecular organic layer is formed by vacuum deposition.

In one embodiment, the polymer organic layer includes a hole transport layer (HTL) and an emissive layer (EML). The HTL may be Poly(3,4-ethylenedioxythiophene) poly(styrenesulfonate) (PEDOT), and the EML may be formed of a polymer organic material, such as poly-phenylenevinylene (PPV) or polyfluorene, by screen printing, inkjet printing, etc. An organic light emitting diode (OLED) is formed in this way and then sealed up to block external air.

In one embodiment, the pixel defining film 120 may be an organic insulating film, an inorganic insulating film, or an organic-inorganic hybrid film that have single-layered or multi-layered structures.

The organic insulating film may be formed of, for example, polymer, examples of which include general-use polymer (e.g., PMMA, PS, etc.), polymer derivatives having a phenol group, acryl-based polymer, imide-based polymer, arylether-based polymer, amide-based polymer, fluorine-based polymer, parylene-based polymer, vinylalchohol-based polymer, and a blend thereof. The inorganic insulating film may be formed of, for example, $SiO_2$, SiNx, SiON, $Al_2O_3$, $TiO_2$, $Ta_2O_5$, $HfO_2$, $ZrO_2$, BST, or PZT.

In one embodiment, the pixel defining film 120 may be formed using an inkjet method. First, a portion of the pixel electrode 131 is surface-finished. The surface finishing uses fluorine-based plasma to make the portion of the pixel electrode 131 have a hydrophobic surface. The fluorine-based plasma is formed by fluorine-based gas, such as, $CF_4$ or $C_3F_8$. Then, a solution including an insulative material is spit onto the TFT substrate 100 from an inkjet head, thereby forming the pixel defining film 120. At this time, not the pixel defining film 120 but the aperture 121 exposing the pixel electrode 131 is formed on the surface-finished portion of the pixel electrode 131.

In one embodiment, when adhesiveness between an exposed surface of the TFT substrate 100 and ink is not good, that is, when the surface of the TFT substrate 100 is hydrophobic, the following is performed. The exposed surface of the TFT substrate 100 and the surface of the pixel electrode 131 excluding the surface on which the aperture 121 is formed are surface-finished using, for example, Ar plasma and $O_2$ plasma to become hydrophilic, thereby improving the adhesiveness with ink. Thereafter, when ink including an insulative material for forming a pixel defining film is spit onto the surface of the TFT substrate 100, only the surface-finished and adhesiveness-improved surfaces of the TFT substrate 100 and the pixel electrode 131 are coated with the pixel defining film 120. In this embodiment, the pixel defining film 120 is not formed on a portion of the pixel electrode 131 that is not surface finished using plasma.

In one embodiment, a conductor 140 may be formed on the pixel defining film 120. In one embodiment, the conductor 140 may be various lines or electrodes. For example, the conductor 140 may be a data line, a scan line, a Vdd line as shown in FIG. 1, or a bus line for preventing voltage drops of the data line, the scan line, and the Vdd line. Alternatively, as described later, the conductor 140 may be an electrode, such as, a TFT or a capacitor. In another embodiment, the conductor 140 may include a metal, such as, Ag, Mg, Al, Pt, Pd, Au, Ni, Nd, Ir, Cr, Li, Ca, or a compound thereof, or a transparent conductive material, such as, ITO, IZO, In$_2$O$_3$, or ZnO. In another embodiment, the conductor 140 may be formed of a conductive organic material or conductive paste in which conductive particles, such as, Ag, Mg, or Cu, are included.

In one embodiment, when the conductor 140 is formed on the pixel defining film 120, as shown in FIG. 2, a capping layer 150 is formed on the conductor 140 to electrically insulate the conductorl4O from the opposite electrode 133.

Figure 3:
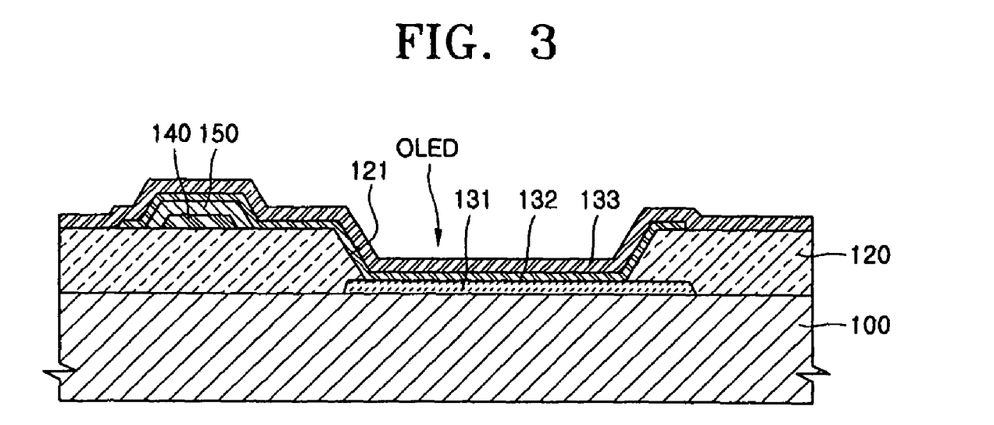

Also, the capping layer 150 passivates a rough surface of the conductor 140. Even when the organic light emitting layer 132 exists between the conductor 140 and the opposite electrode 133 as shown in FIG. 3, the capping layer 150 covers the conductor 140 to prevent the conductor 140 and the opposite electrode 133 from short-circuiting due to the roughness of the surface of the conductor 140. Because the organic light emitting layer 132 is actually formed with a thickness of about 1000 to about 2000 Å, the thickness of the organic light emitting layer 132 is so small that the roughness of the surface of the conductor 140 may cause the conductor 140 and the opposite electrode 133 to short-circuit. Hence, the capping layer 150 can prevent this short circuit.

In one embodiment, the capping layer 150 is more useful when the conductor 140 is formed of the aforementioned conductive material. In other words, when the conductor 140 is formed by printing conductive paste including conductive particles of, for example, Ag, Mg, or Cu, using an inkjet method and then sintering the conductive paste, the conductor 140 can be formed thickly with its center and edges having the peak thicknesses. In this case, the capping layer 150 of an insulative material covers the conductor 140 to prevent the opposite electrode 33 and the conductor 140 from short-circuiting.

In one embodiment, the capping layer 150 may be an organic film, an inorganic film, or an organic-inorganic hybrid film that have single-layered or multi-layered structures. The inorganic film may be formed of, for example, SiO$_2$, SiNx, SiON, Al$_2$O$_3$, TiO$_2$, Ta$_2$O$_5$, HfO$_2$, ZrO$_2$, BST, or PZT. The organic film may be formed of, for example, polymer, examples of which include general-use polymer (e.g., PMMA, PS, etc.), polymer derivatives having a phenol group, acryl-based polymer, imide-based polymer, arylether-based polymer, amide-based polymer, fluorine-based polymer, parylene-based polymer, vinylalchohol-based polymer, and a blend thereof.

As described above, the capping layer 150 is not limited to an inorganic monolayer or an organic monolayer but may be a multilayer of an organic material and an inorganic material.

In one embodiment, the capping layer 150 may be formed of any material having a low surface roughness in addition to the aforementioned insulating material. In another embodiment, the capping layer 150 may be even formed of a conductor or a semiconductor. In other words, when a surface roughness of the conductor 140 below the capping layer 150 is irregular, the capping layer 150 may be formed of any material that can ease the irregular surface roughness. The materials that can be used to form the capping layer 150 can be equally applied to all of the embodiments to be described below.

Figure 4:
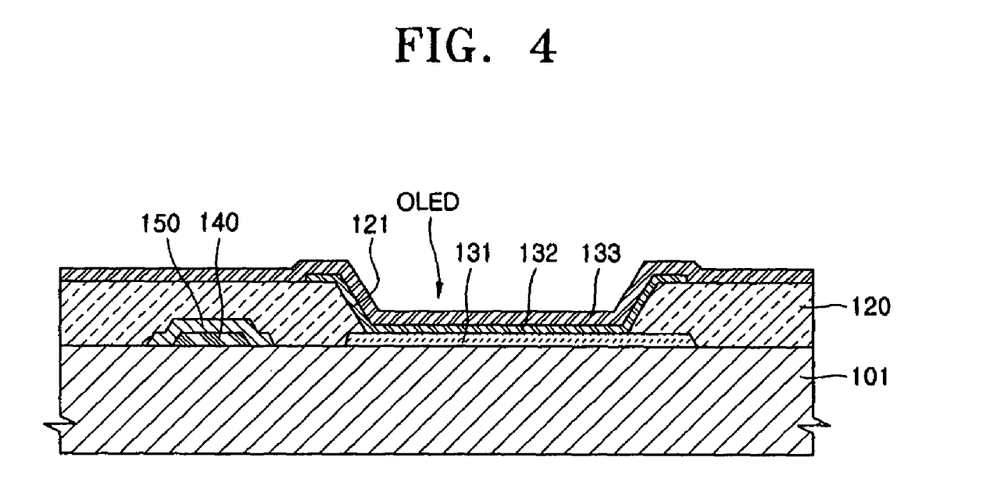

FIG. 4 illustrates an organic light emitting display according to another embodiment of the present invention. In this embodiment, the conductor 140 is formed to be level with the pixel electrode 131. In other words, the conductor 140 is formed on the TFT substrate 101. In one embodiment, the conductor 140 is formed of the same material as that of the pixel electrode 131 or a conductive material other than the material of the pixel electrode 131.

As described above, when the capping layer 150 is also formed to cover the conductor 140 in this embodiment, planarization of the surface of the conductor 140 can be improved. Even when the pixel defining film 120, which is an insulative film covering the conductor 140 and the capping layer 150 as shown in FIG. 4, is very thinly formed, short-circuiting of the conductor 140 and the opposite electrode 133 can be prevented by the capping layer 150. In one embodiment, as described above, the capping layer i50 of FIG. 4 may be an organic film, an inorganic film, or an organic-inorganic hybrid film that have a monolayer or multiplayer structure. This applies to the remaining embodiments.

In one embodiment, the structure of the capping layer 150 that covers the conductor 140 can be equally applicable to cases where a conductor exists within a light emitting area that displays an image.

Figure 5:
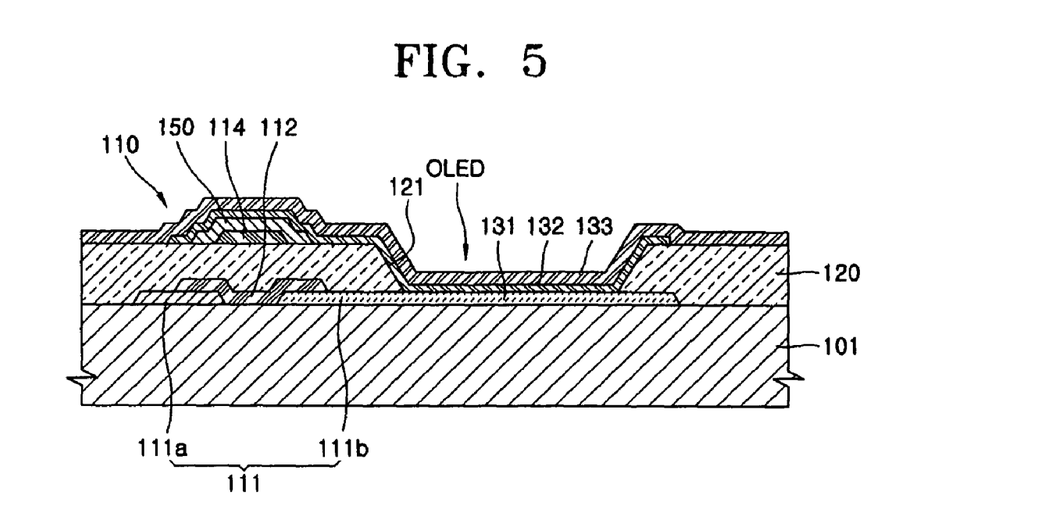

FIG. 5 illustrates an organic light emitting display according to another embodiment of the present invention. Referring to FIG. 5, a source/drain electrode 111 is formed on a substrate 101, and a pixel electrode 131 extends from one electrode of the source/drain electrode 111, for example, a source electrode 111a and a drain electrode 111b. In one embodiment, as shown in FIG. 5, two side portions of a semiconductor layer 112 are formed directly on the source/drain electrode 111. In this embodiment, the remaining portion of the semiconductor layer 112 is formed on the substrate 101. A pixel defining film 120 is formed on the substrate 101, and a gate electrode 114 is formed on the pixel defining film 120. Accordingly, the pixel defining film 120 also serves as a gate insulating film. The pixel defining film 120 has an aperture 121 formed to expose a predetermined portion of the pixel electrode 131. An organic light emitting layer 132 is formed on the exposed portion of the pixel electrode 131. An opposite electrode 133 is formed on the organic light emitting layer 132, thereby forming an organic light emitting diode (OLED).

The substrate 101 may be formed of glass, plastic, or metal. Examples of the metal include metallic foil, such as, stainless steel, Ti, Mo, Invar alloy, Inconel alloy, Kovar alloy, etc. Examples of the plastic include a plastic film selected from the group consisting of polyethrsulphone (PES), polyacrylate (PAR), polyetherimide (PEI), polyethylene naphthalene (PEN), polyethylene terepthalate (PET), polyphenylene sulfide (PPS), polyallylate, polyimide, polycarbonate (PC), cellulose tri acetate (TAC), and cellulose acetate propionate (CAP).

An insulating layer, for example, a buffer layer, a barrier layer, or an impurities-diffusion prevention layer may be formed on one side or both sides of the substrate 101.

In one embodiment, the semiconductor layer 112 may be formed of an inorganic semiconductor or an organic semiconductor. Examples of the inorganic semiconductor include CdS, GaS, ZnS, CdSe, CaSe, ZnSe, CdTe, SiC, and Si. Examples of the organic semiconductor include pentacene, tetracene anthracene, naphthalene, alpha-6-thiophen, alpha-4-thiophen, perylens and derivatives, rubrene and derivatives, coronene and derivatives, perylene tetracarboxylic diimide and derivatives, perylene tetracarboxylic dianhydride and derivatives, oligoacene of naphthalene and derivatives, oligothiophen of alpha-5-thiophen and derivatives, phthalocyanine containing or not containing metal and derivatives, naphthalene tetracarboxylic diimide and derivatives, pyromellitic dianhydride and derivatives, pyromellitic diimide and derivatives, conjugate polymer containing thiophen and derivatives, and polymer including fluorine and derivatives.

In one embodiment, the source/drain electrode 111 formed on the substrate 101 may be formed of different materials. In one embodiment, when a drain electrode 111b is incorporated into the pixel electrode 131 as shown in FIG. 5, a source electrode 111a includes a material having a work function matching with that of the semiconductor layer 112. This is because contact resistance between the source electrode 111a and the semiconductor layer 112 is important, and the drain electrode 111b includes a material used to form the pixel electrode 131. For example, when the semiconductor layer 112 is formed of a p-type semiconductor, the source electrode 11a includes an electrode material having a higher work function than that of the semiconductor layer 112. When the semiconductor layer 112 is formed of a p-type organic semiconductor, the source electrode 111a may include a metal electrode material selected from, for example, Au, Pt, and Pd.

In one embodiment, the gate electrode 114 may be covered by the capping layer 150. Even when the gate electrode 114 is formed of a material having a bad surface roughness, the roughness of the surface of the gate electrode 114 can be sufficiently offset by the capping layer 150. Thus, short-circuiting of the gate electrode 114 and the opposite electrode 133 can be prevented.

As sown in FIG. 5, the organic light emitting layer 132 extends over the capping layer 150, thus increasing the capping effect of the capping layer 150 with respect to the gate electrode 114.

Figure 6:
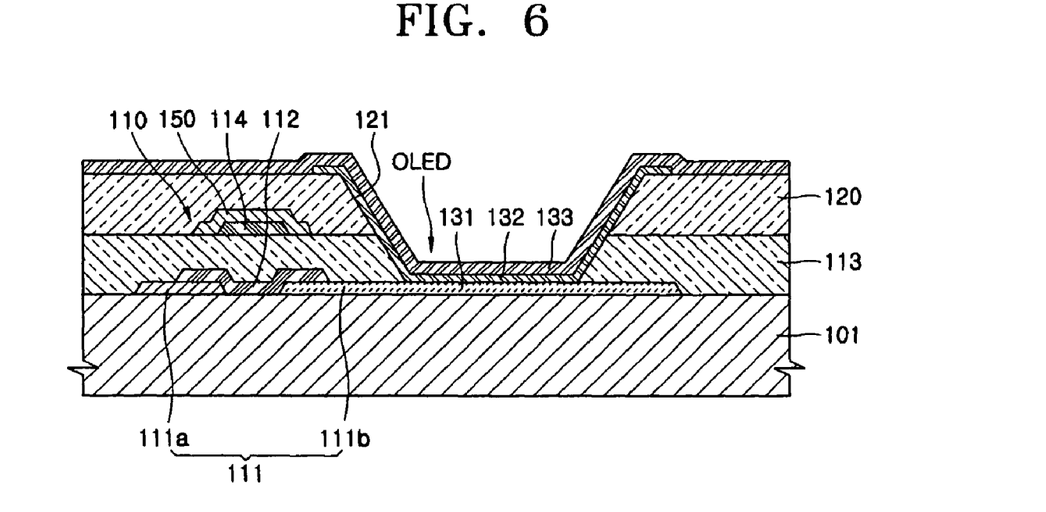

FIG. 6 illustrates an organic light emitting display according to another embodiment of the present invention. In contrast with the embodiment of FIG. 5, a gate insulating film 113 is interposed between the gate electrode 114 and the semiconductor layer 112, and a pixel defining film 120 is formed on the capping layer 150. In one embodiment, similar to the pixel defining film 120 in the previous embodiments, the gate insulating film 113 is formed of an organic film, an inorganic film, or an organic-inorganic hybrid film that have a monolayer or multiplayer structure.

The aperture 121 that exposes the pixel electrode 131 is formed in both the gate insulating film 113 and the pixel defining film 120. An organic light emitting layer 132 and an opposite electrode 133 are sequentially formed on the exposed surface of the pixel electrode 131. The other structures are the same as those of the FIG. 5 embodiment, so they will not be described herein.

Figure 7:
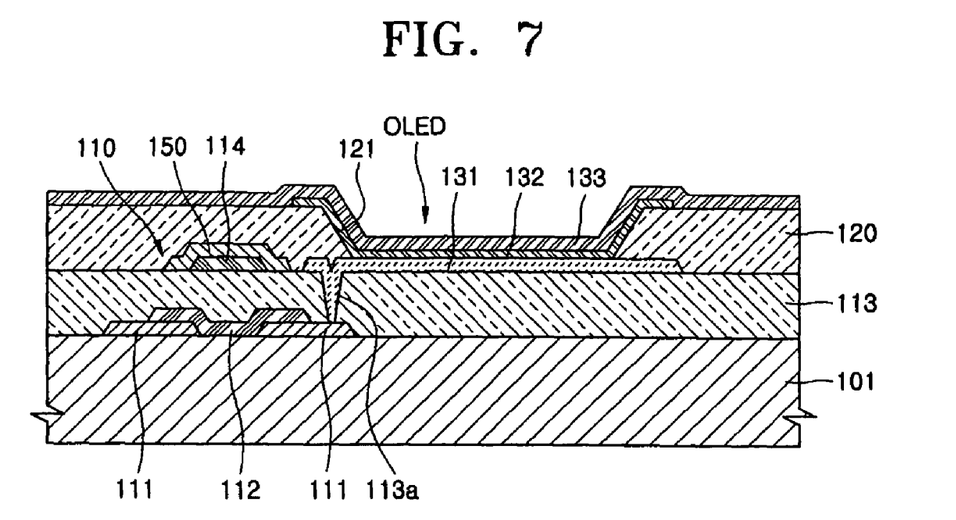

FIG. 7 illustrates an organic light emitting display according to another embodiment of the present invention. In contrast with the embodiment of FIG. 6, the pixel electrode 131 is formed on the gate insulating film 113, a contact hole 113a is formed in the gate insulating film 113, and the pixel electrode 131 contacts one of the source/drain electrode 111. In this case, the contact hole 113a may be formed by laser etching or photolithography.

In this embodiment, the source/drain electrode 111 is formed independently of the pixel electrode 131, so the source/drain electrode 111 may be formed of an identical material. The pixel electrode 131 is formed of the above-described material that can be used to form the pixel electrode 131.

Figure 8:
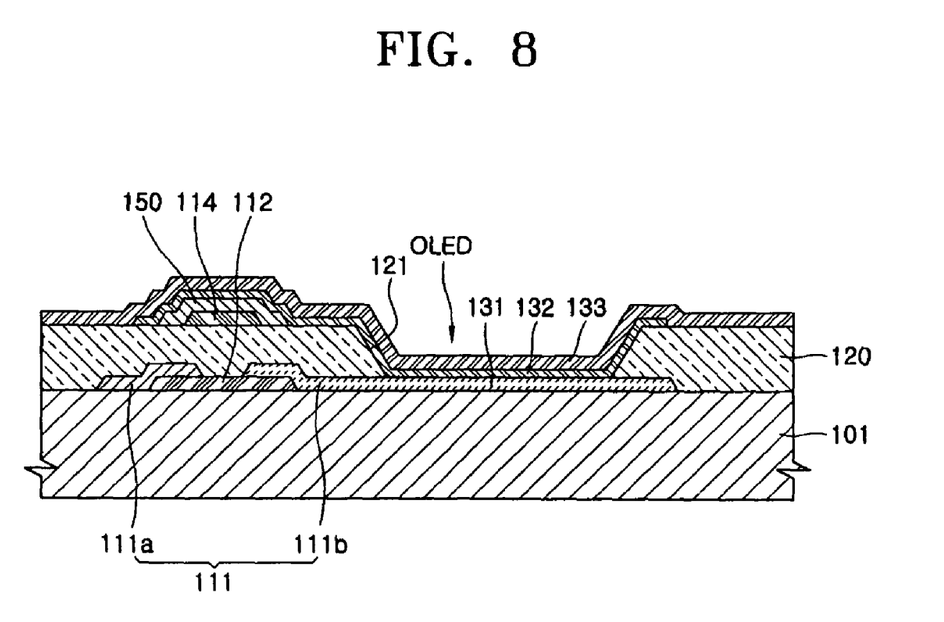

FIG. 8 illustrates an organic light emitting display according to another embodiment of the present invention. In contrast with the embodiment of FIG. 5, the semiconductor layer 112 is first formed on the substrate 101, and the source/drain electrode 111 is then formed on the semiconductor layer 112. All the other structures are the same as those of the FIG. 5 embodiment, so they will not be described herein.

Figure 9:
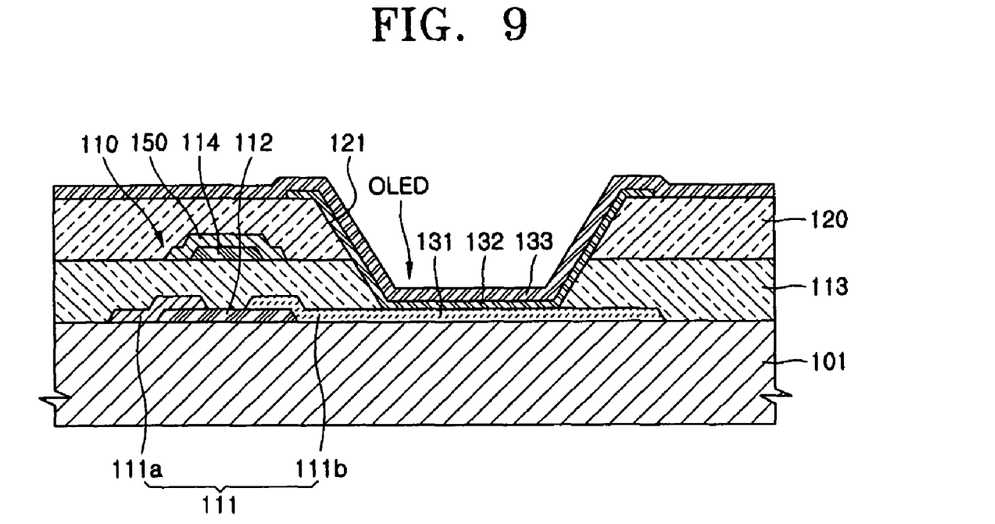

FIG. 9 illustrates an organic light emitting display according to another embodiment of the present invention. In contrast with the embodiment of FIG. 6, the semiconductor layer 112 is first formed on the substrate 101, and the source/drain electrode 111 is then formed on the semiconductor layer 112. All the other structures are the same as those of the FIG. 6 embodiment, so they will not be described herein.

Figure 10:
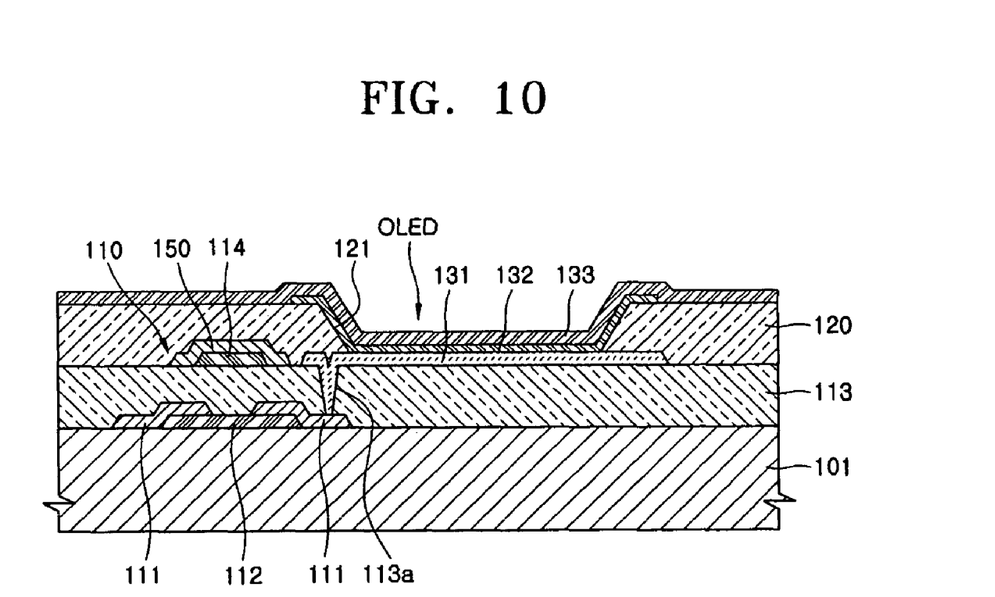

FIG. 10 illustrates an organic light emitting display according to another embodiment of the present invention. In contrast with the embodiment of FIG. 7, the semiconductor layer 112 is first formed on the substrate 101, and the source/drain electrode 111 is then formed on the semiconductor layer 112. All the other structures are the same as those of the FIG. 7 embodiment, so the description will be omitted.

The above-described embodiments relate to a top gate structure in which a gate electrode is located over a source/drain electrode and a semiconductor layer. Hereinafter, a bottom gate structure in which the gate electrode is located under the source/drain electrode and the semiconductor layer is described below with reference to embodiments of FIGS. 11 through 14.

Figure 11:
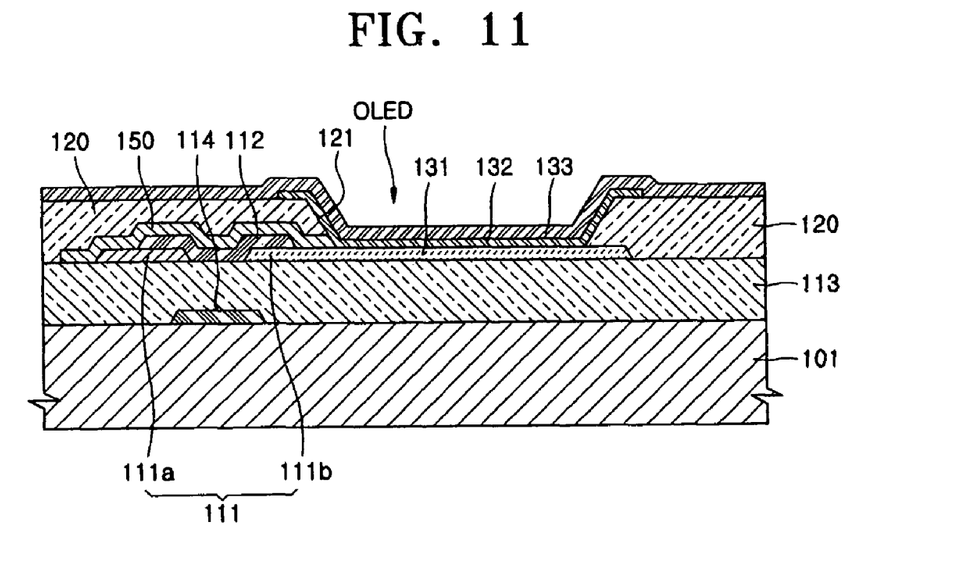

In the embodiment of FIG. 11, a gate electrode 114 is formed on a substrate 101 and then covered by a gate insulating film 113. Thereafter, a source electrode 111a and a drain electrode 111b are formed on the gate insulating film 113, and a pixel electrode 131 is incorporated into the drain electrode 111b. The source and drain electrodes 111a and 111b and the pixel electrode 131 are covered by a pixel defining film 120. An aperture 121 is formed in the pixel defining film 120, and an organic light-emitting layer 132 and an opposite electrode 133 are sequentially stacked on an exposed surface of the pixel electrode 131. The materials used to form the aforementioned elements are the same as those used in the previous embodiments.

In this embodiment, a capping layer 150 may be formed to cover a semiconductor layer 112 and at least one of the source and drain electrodes 111a and 111b.

Figure 12:
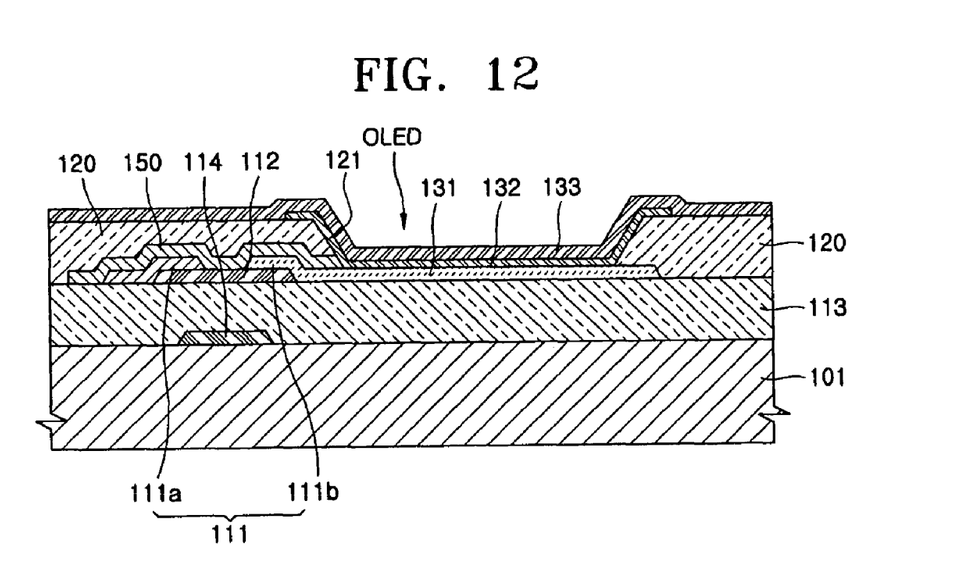

FIG. 12 illustrates an organic light emitting display according to still another embodiment of the present invention. In contrast with the embodiment of FIG. 11, the semiconductor layer 112 is first formed on the gate insulating film 113, and the source/drain electrode 111 is then formed on the semiconductor layer 112. All the other structures are the same as those of the FIG. 11 embodiment, so they will not be described herein.

Figure 13:
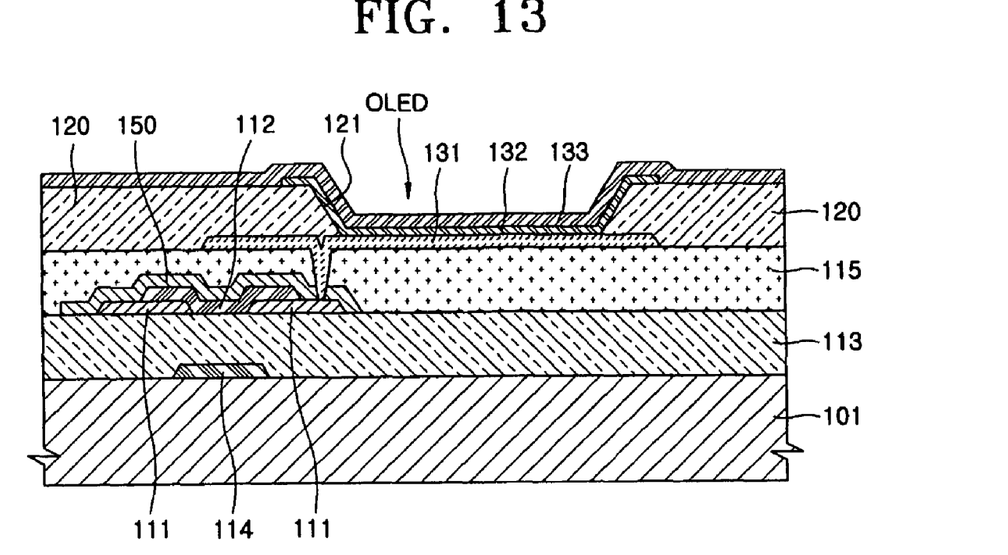

FIG. 13 illustrates an organic light emitting display according to still another embodiment of the present invention. Referring to FIG. 13, a source/drain electrode 111 is formed on a gate insulating film 113, and a semiconductor layer 112 is formed between the source/drain electrode 111. Then, a capping layer 150 is formed to cover the semiconductor layer 112 and the source/drain electrode 111. In this embodiment, a planarization insulating film 115 is further formed to cover the capping layer 150. A pixel electrode 131 contacting one of the source/drain electrode 111 is formed on the planarization insulating film 115. A pixel defining film 120 is formed to cover the pixel electrode 131, and an aperture 121 is formed in the pixel defining film 120. An organic light emitting layer 132 and an opposite electrode 133 are sequentially stacked on an exposed surface of the pixel electrode 131. In one embodiment, the materials used to form the aforementioned elements are the same as those used in the previous embodiments.

Figure 14:
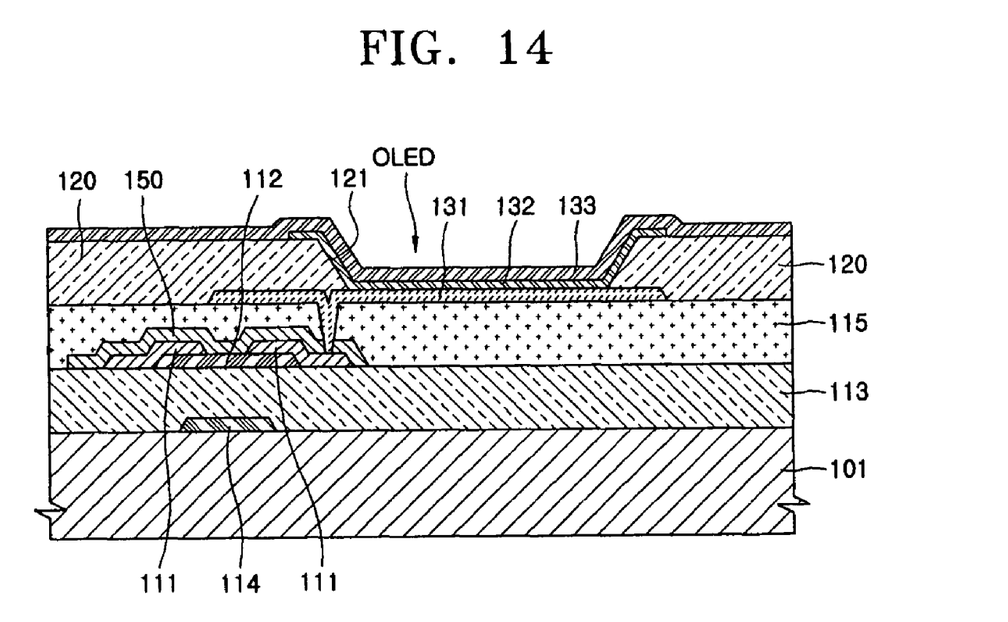

FIG. 14 illustrates an organic light emitting display according to yet another embodiment of the present invention. In contrast with the embodiment of FIG. 13, the semiconductor layer 112 is first formed on the gate insulating film 113, and the source/drain electrode 111 is then formed on the semiconductor layer 112. All the other structures, which are the same as those of the FIG. 13 embodiment, will not be described herein. Although organic light emitting displays have been described above, the present invention is equally applicable to other flat panel displays, such as, liquid crystal displays.

Figure 15:
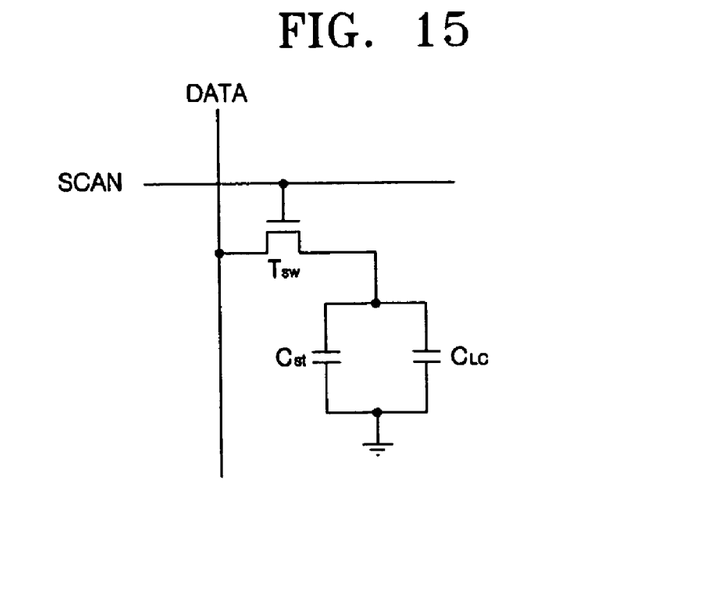
FIG. 15 is a circuit diagram of a pixel of a liquid crystal display according to another embodiment of the present invention.

FIG. 15 is a circuit diagram of a pixel of a liquid crystal display according to yet another embodiment of the present invention. Referring to FIG. 15, each pixel of the liquid crystal display includes a switching TFT ($T_{sw}$), a storage capacitor ($C_{st}$), and a liquid crystal device ($C_{LC}$).

The switching TFT ($T_{sw}$) is switched on/off by a scan signal applied to a scan line (SCAN) and transmits a data signal applied to a data line (DATA) to the storage capacitor ($C_{st}$) and the liquid crystal device ($C_{LC}$). The storage capacitor ($C_{st}$) stores the data signal received from the switching TFT ($T_{sw}$) for one frame.

Figure 16:
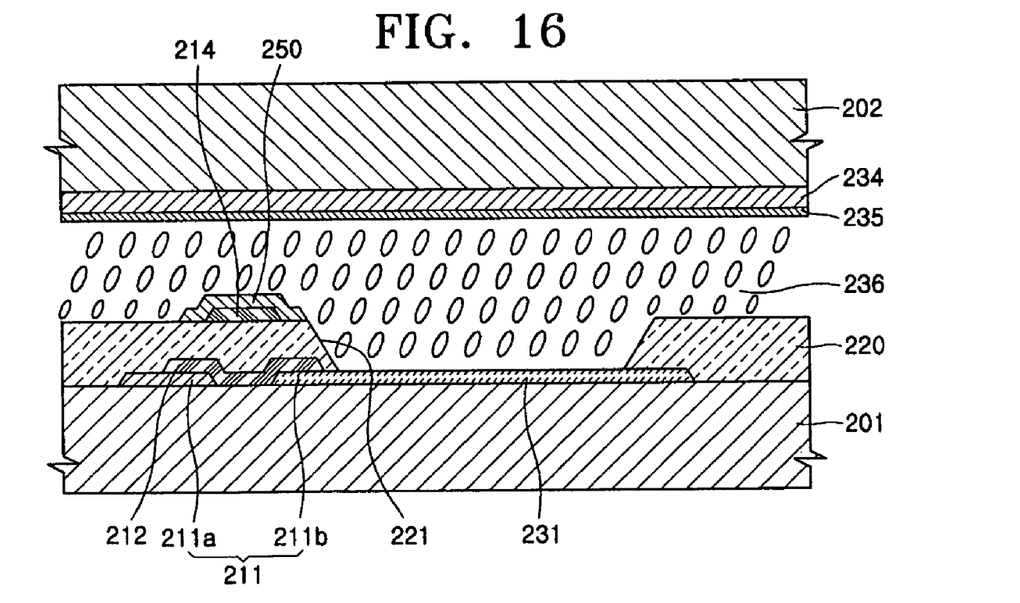
FIG. 16 is a cross-sectional view of an embodiment of the pixel of FIG. 15.

FIG. 16 is a cross-sectional view of an embodiment of the liquid crystal display of FIG. 15. Referring to FIG. 16, a source electrode 211a and a drain electrode 211b are formed on a substrate 201, and a pixel electrode 231 extends from the drain electrode 211b. A semiconductor layer 212 is formed on the source/drain electrode 211 and contacts the source/drain electrode 211. A pixel defining film 220 is formed on the substrate 201, and a gate electrode 214 is formed on the pixel defining film 220. Hence, the pixel defining film 220 also serves as a gate insulating film. The pixel defining film 220 has an aperture 221 to expose a predetermined portion of the pixel electrode 231. A capping layer 250 is formed on the gate electrode 214 to protect the same.

Meanwhile, an opposite substrate 202 is disposed directly over the substrate 201. A color filter 234 and a common electrode 235 are sequentially formed on a bottom surface of the opposite substrate 202.

Although not shown in FIG. 16, orientation films may be further formed on an upper surface of the pixel electrode 231 and a bottom surface of the common electrode 235.

Even in the liquid crystal display having this structure, the gate electrode 214 is covered by the capping layer 250. Thus, the gate electrode 214 can be sufficiently protected by the capping layer 250, and exposure of the gate electrode 214 to a liquid crystal layer 236 can be prevented.

Although only the embodiment of FIG. 16 is shown as an embodiment of a liquid crystal display, the present invention is not limited to the embodiment of FIG. 16. Of course, the embodiments of FIGS. 2 through 15 may be applied to the liquid crystal display.

In addition, the present invention is applicable to various flat panel displays, such as, electron emission displays in addition to organic light emitting displays and liquid crystal displays.

According to embodiments of the present invention, the roughness of the surface of a conductor can be offset by a capping layer formed on the conductor, and thus, an electrical short of the conductor and an opposite electrode can be prevented.

When the conductor or an electrode is formed by printing conductive paste, the conductor or the electrode has an uneven thickness. In one embodiment, even when the conductor or the electrode has a peak, the capping layer can prevent the peak of the conductor or electrode from short-circuiting an electrode formed on and insulated from the conductor or electrode.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A flat panel display, comprising:
a substrate;
an insulating film formed over the substrate, wherein a recess is defined in the insulating film;
a pixel electrode formed over the substrate, wherein at least part of the pixel electrode is formed in the recess of the insulating film;
a conductor formed on the insulating film;
a capping layer covering the conductor, wherein the capping layer does not extend to a region which is directly below the recess, and wherein a surface roughness of the capping layer is lower than that of the conductor;
an opposing electrode formed over the insulating film, conductor, capping layer and pixel electrode, wherein the opposing electrode is electrically insulated from the conductor; and
a light emitting layer interposed between the pixel electrode and opposing electrode, wherein at least part of the light emitting layer is formed in the recess of the insulating film,
wherein the light emitting layer is formed on the capping layer, and wherein the opposing electrode is formed on the light emitting layer.

2. The flat panel display of claim 1, wherein the pixel electrode is formed of a transparent material, and the opposing electrode is formed of a reflective material.

3. The flat panel display of claim 1, wherein the pixel electrode is formed of a reflective material, and the opposing electrode is formed of a transparent material.

4. The flat panel display of claim 1, wherein the pixel electrode and the opposing electrode are formed of a transparent material.

5. The flat panel display of claim 1, wherein the pixel electrode is formed of a transparent material.

6. The flat panel display of claim 1, wherein the conductor is formed of paste including conductive particles.

7. The flat panel display of claim 1, wherein the capping layer is formed of an inorganic material.

8. The flat panel display of claim 7, wherein the inorganic material is at least one of the following: $SiO_2$, SiNx, SiON, $Al_2O_3$, $TiO_2$, $Ta_2O_5$, $HfO_2$, $ZrO_2$, BST, and PZT.

9. The flat panel display of claim 1, wherein the capping layer is formed of an organic material.

10. The flat panel display of claim 9, wherein the organic material is at least one of the following: PMMA, PS, polymer derivatives having a phenol group, acryl-based polymer, imide-based polymer, arylether-based polymer, amide-based polymer, fluorine-based polymer, parylene-based polymer, vinylalchohol-based polymer, and a blend thereof.

11. A flat panel display, comprising:
a substrate;
an insulating film formed over the substrate, wherein a recess is defined in the insulating film;
a pixel electrode formed over the substrate, wherein at least part of the pixel electrode is formed in the recess of the insulating film;
at least one conductor formed over the substrate;

a capping layer covering the conductor, wherein the capping layer does not extend to a region which is directly below the recess, and wherein a surface roughness of the capping layer is lower than that of the conductor;

an opposing electrode electrically insulated from the conductor and formed over the insulating film, conductor, capping layer and pixel electrode; and a light emitting layer interposed between the pixel electrode and opposing electrode, wherein at least part of the light emitting layer is formed in the recess of the insulating film, wherein the light emitting layer is formed on the capping layer, and wherein the opposing electrode is formed on the light emitting layer.

12. The flat panel display of claim 11, wherein the pixel electrode is formed of a transparent material, and the opposing electrode is formed of a reflective material.

13. The flat panel display of claim 11, wherein the pixel electrode is formed of a reflective material, and the opposing electrode is formed of a transparent material.

14. The flat panel display of claim 11, wherein the pixel electrode and the opposing electrode are formed from a transparent material.

15. The flat panel display of claim 11, wherein the conductor is formed of paste including conductive particles.

16. The flat panel display of claim 11, wherein the capping layer is formed of an inorganic material.

17. The flat panel display of claim 16, wherein the inorganic material is at least one of the following: $SiO_2$, SiNx, SiON, $Al_2O_3$, $TiO_2$, $Ta_2O_5$, $HfO_2$, $ZrO_2$, BST, and PZT.

18. The flat panel display of claim 11, wherein the capping layer is formed of an organic material.

19. The flat panel display of claim 18, wherein the organic material is at least one of the following: PMMA, PS, polymer derivatives having a phenol group, acryl-based polymer, imide-based polymer, arylether-based polymer, amide-based polymer, fluorine-based polymer, parylene-based polymer, vinylalchohol-based polymer, and a blend thereof.

20. The flat panel display of claim 11, wherein the substrate supports at least one thin film transistor.

21. The flat panel display of claim 20, wherein the thin film transistor comprises:
source and drain electrodes;
a semiconductor layer contacting the source and drain electrodes;
a gate electrode insulated from the source and drain electrodes and the semiconductor layer; and
a capping layer covering at least one of i) the source and drain electrodes and ii) the gate electrode.

22. The flat panel display of claim 21, wherein the capping layer covers the gate electrode.

23. The flat panel display of claim 22, wherein the gate electrode is formed of a paste including conductive particles.

24. The flat panel display of claim 22, wherein the capping layer is formed of an inorganic material.

25. The flat panel display of claim 24, wherein the inorganic material is at least one of the following: $SiO_2$, SiNx, SiON, $Al_2O_3$, $TiO_2$, $Ta_2O_5$, $HfO_2$, $ZrO_2$, BST, and PZT.

26. The flat panel display of claim 22, wherein the capping layer is formed of an organic material.

27. The flat panel display of claim 26, wherein the organic material is at least one of the following: PMMA, PS, polymer derivatives having a phenol group, acryl-based polymer, imide-based polymer, arylether-based polymer, amide-based polymer, fluorine-based polymer, parylene-based polymer, vinylalchohol-based polymer, and a blend thereof.

28. The flat panel display of claim 21, wherein the capping layer covers the source and drain electrodes.

29. The flat panel display of claim 28, wherein the source and drain electrodes are formed of paste including conductive particles.

30. The flat panel display of claim 28, wherein the capping layer is formed of an inorganic material.

31. The flat panel display of claim 30, wherein the inorganic material is at least one of the following: $SiO_2$, SiNx, SiON, $Al_2O_3$, $TiO_2$, $Ta_2O_5$, $HfO_2$, $ZrO_2$, BST, and PZT.

32. The flat panel display of claim 28, wherein the capping layer is formed of an organic material.

33. The flat panel display of claim 32, wherein the organic material is at least one of the following: PMMA, PS, polymer derivatives having a phenol group, acryl-based polymer, imide-based polymer, arylether-based polymer, amide-based polymer, fluorine-based polymer, parylene-based polymer, vinylalchohol-based polymer, and a blend thereof.

34. A method of manufacturing a flat panel display, comprising:
coating portions of a substrate with a paste including conductive particles;
forming an insulating film over the substrate, wherein a recess is defined in the insulating film;
forming a pixel electrode over the substrate, wherein at least part of the pixel electrode is formed in the recess of the insulating film;
forming a conductor of the paste on the insulating film;
forming a capping layer to cover the conductor, wherein the capping layer does not extend to a region which is directly below the recess, and wherein a surface roughness of the capping layer is lower than that of the conductor;
forming an opposing electrode electrically insulated from the conductor and over the insulating film, conductor, capping layer and pixel electrode; and
forming a light emitting layer interposed between the pixel electrode and opposing electrode, wherein at least part of the light emitting layer is formed in the recess of the insulating film,
wherein the light emitting layer is formed on the capping layer, and wherein the opposing electrode is formed on the light emitting layer.

35. The method of claim 34, wherein the paste including the conductive particles is printed on the substrate using an inkjet printing method.

36. The method of claim 34, wherein the capping layer is formed of an inorganic material.

37. The method of claim 36, wherein the inorganic material is at least one of the following: $SiO_2$, SiNx, SiON, $Al_2O_3$, $TiO_2$, $Ta_2O_5$, $HfO_2$, $ZrO_2$, BST, and PZT.

38. The method of claim 34, wherein the capping layer is formed of an organic material.

39. The method of claim 38, wherein the organic material is at least one of the following: PMMA, PS, polymer derivatives having a phenol group, acryl-based polymer, imide-based polymer, arylether-based polymer, amide-based polymer, fluorine-based polymer, parylene-based polymer, vinylalchohol-based polymer, and a blend thereof.

40. The flat panel display of claim 1, wherein the capping layer is formed of a material having a low surface roughness.

41. The flat panel display of claim 1, wherein the capping layer is formed of a conductor or a semiconductor.

42. The flat panel display of claim 11, wherein the insulating film is further formed on the capping layer.

43. The flat panel display of claim 42, wherein the opposing electrode is further formed on the insulating film.

44. The flat panel display of claim 28, further comprising a planarization insulating film covering the capping layer.

45. The method of claim 35, wherein the conductive particles includes at least one of Ag, Mg and Cu.

46. The flat panel display of claim 1, wherein the capping layer does not cross the region which is directly below the recess.

47. The flat panel display of claim 11, wherein the capping layer does not cross the region which is directly below the recess.

48. The method of claim 34, wherein the capping layer does not cross the region which is directly below the recess.

\* \* \* \* \*